(12) United States Patent
Konishi (10) Patent No.: US 11,933,839 B2
(45) Date of Patent: Mar. 19, 2024

(54) INSPECTION APPARATUS AND INSPECTION METHOD

(71) Applicant: Tokyo Electron Limited, Tokyo (JP)

(72) Inventor: Kentaro Konishi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/961,471

(22) Filed: Oct. 6, 2022

(65) Prior Publication Data

US 2023/0124392 A1 Apr. 20, 2023

(30) Foreign Application Priority Data

Oct. 19, 2021 (JP) ................................ 2021-171036

(51) Int. Cl.
| | |
|---|---|
| *G01R 31/00* | (2006.01) |
| *G01R 1/02* | (2006.01) |
| *G01R 1/04* | (2006.01) |
| *G01R 1/067* | (2006.01) |
| *G01R 1/073* | (2006.01) |
| *G01R 31/20* | (2006.01) |
| *G01R 31/26* | (2020.01) |
| *G01R 31/28* | (2006.01) |

(52) U.S. Cl.
CPC ..... *G01R 31/2867* (2013.01); *G01R 1/07342* (2013.01)

(58) Field of Classification Search
CPC ........ G01R 31/00; G01R 31/02; G01R 31/20; G01R 31/26; G01R 31/28; G01R 31/2867; G01R 1/02; G01R 1/04; G01R 1/067; G01R 1/073
See application file for complete search history.

(56) References Cited

U.S. PATENT DOCUMENTS

2007/0159194 A1* 7/2007 Hasegawa .......... G01R 31/2889
324/750.19

FOREIGN PATENT DOCUMENTS

JP 2016-058506 A 4/2016

* cited by examiner

*Primary Examiner* — Neel D Shah
(74) *Attorney, Agent, or Firm* — Fenwick & West LLP

(57) ABSTRACT

An inspection apparatus for a substrate, comprising: a placing member on which a substrate is placed; a holder configured to hold a probe card having probes; positioning members to be in contact with an upper surface of the placing member to define a height of the placing member with respect to the probes; an adjustment mechanism configured to adjust heights of the positioning members; a detection device; and a control. The controller is configured to execute: positioning the positioning member to a reference height at which an overdrive amount becomes zero, based on the detection results of the probes, the placing member, and the positioning member; and acquiring a height of the positioning member at which a desired overdrive amount is obtained, and raising the placing member while adjusting a driving amount of the adjustment mechanism until the placing member reaches the height.

5 Claims, 7 Drawing Sheets

INSPECTION APPARATUS AND INSPECTION METHOD

CROSS-REFERENCE TO RELATED APPLICATIONS

This application claims priority to Japanese Patent Application No. 2021-171036 filed on Oct. 19, 2021, the entire contents of which are incorporated herein by reference.

TECHNICAL FIELD

The present disclosure relates to an inspection apparatus and an inspection method.

BACKGROUND

Japanese Laid-open Patent Publication No. 2016-58506 discloses a wafer inspection apparatus for inspecting a wafer by bringing a probe card into contact with the wafer by a pressure. In this wafer inspection apparatus, a pressure of a vacuum attraction force that is applied to a gap between the probe card and the wafer in a sealed space by evacuation of a vacuum mechanism is substantially accurately equal to a pressure of a pressing force that is applied to a gap between the probe card and the wafer by lifting a chuck top and a movable stage before the evacuation.

SUMMARY

In the technique of the present disclosure, probes are brought into proper contact with a substrate regardless of the heights of the probes in an inspection apparatus for inspecting a substrate.

In accordance with an aspect of the present disclosure, there is an inspection apparatus for inspecting a substrate, comprising: a placing member on which a substrate is placed; a holder configured to hold a probe card having probes to be in contact with the substrate; a plurality of positioning members to be in contact with an upper surface of the placing member or a bottom surface of the holder to define a height of the placing member with respect to the probes; an adjustment mechanism configured to adjust heights of the positioning members; a detection device configured to detect the probes, the placing member and the positioning members; and a controller, wherein the controller is configured to execute: acquiring heights of the probes based on a detection result of the probes using the detection device; acquiring a height of the placing member based on a detection result of the placing member using the detection device; acquiring a height of the positioning member based on a detection result of the positioning member using the detection device; positioning the positioning member, using the adjustment mechanism, to a reference height at which an overdrive amount becomes zero, based on the detection results of the probes, the placing member, and the positioning member using the detection device; and acquiring a height of the positioning member at which a desired overdrive amount is obtained, and raising the placing member while adjusting a driving amount of the adjustment mechanism until the placing member reaches the height of the positioning member at which the desired overdrive amount is obtained.

BRIEF DESCRIPTION OF THE DRAWINGS

The objects and features of the present disclosure will become apparent from the following description of embodiments, given in conjunction with the accompanying drawings, in which.

DETAILED DESCRIPTION

In a semiconductor manufacturing process, a plurality of semiconductor devices having a predetermined circuit pattern are formed on a semiconductor wafer (hereinafter referred to as "wafer"). The electrical characteristics of the semiconductor devices formed on the wafer are inspected and the semiconductor devices are classified into non-defective products or defective products. For example, the semiconductor devices are inspected by an inspection apparatus before the wafer is divided into the semiconductor devices.

The inspection apparatus includes a probe card having a plurality of probes that are needle-shaped contact terminals. In order to perform the electrical characteristic inspection, first, the wafer and the probe card are made to be close to each other, and the probes of the probe card are brought into contact with electrodes of the semiconductor devices formed on the wafer. In this state, electric signals are supplied from a tester disposed above the probe card to the semiconductor devices through the probes. The defectiveness of the semiconductor devices is determined Based on the electric signals transmitted from the semiconductor devices to the tester through the probes.

As an example of the inspection apparatus for performing the electrical characteristic inspection, there is known an apparatus in which a sealed space between a chuck top on which a wafer is placed and a pogo frame holding a probe card is depressurized to bring the wafer and the probes of the probe card in the sealed space into contact with each other. In this inspection apparatus, the sealed space is depressurized and contracted to attract the chuck top toward the probe card, i.e., to raise the chuck top, thereby bringing the wafer on the chuck top into contact with the probes of the probe card. At this time, the height of the chuck top has increased by a predetermined overdrive amount after the wafer on the chuck top is brought into contact with the probes. Accordingly, the electrodes of the wafer and the probes are brought into contact with each other regardless of the existence/non-existence of a protective film on the wafer or the like.

The chuck top is held by an aligner and can be moved horizontally and vertically by the aligner. However, when the wafer on the chuck top is brought into contact with the probes and subjected to the electrical characteristic inspection, the chuck top is supported by a bellows forming the sealed space without being supported by the aligner.

Conventionally, the height of the chuck top is set with respect to the pogo frame or the aligner. Specifically, conventionally, the height of the chuck top is determined such that the distance from the pogo frame or the aligner to the chuck top becomes a predetermined value based on the detection result of the height sensor disposed at the pogo frame or the aligner, for example.

The heights of the probes of the probe card (specifically, the heights of the ends of the probes to be in contact with the wafer) varies depending on the temperature of the probe card, and also varies due to thermal expansion or thermal contraction of the pogo frame. Therefore, if the height of the chuck top in performing the electrical characteristic inspection is set with respect to the pogo frame or the aligner as described above, the probes and the wafer (specifically, the electrodes) may not be brought into proper contact with each other.

In view of the above, the technique of the present disclosure brings the probes into proper contact with the substrate regardless of the heights of the probes in the inspection apparatus for inspecting a substrate.

Hereinafter, an inspection apparatus and an inspection method according to the embodiments of the present disclosure will be described with reference to the accompanying drawings. Like reference numerals will be given to like parts having substantially the same functions and configurations in this specification and the drawings, and redundant description thereof will be omitted.

<Inspection Apparatus>

Figure 1:
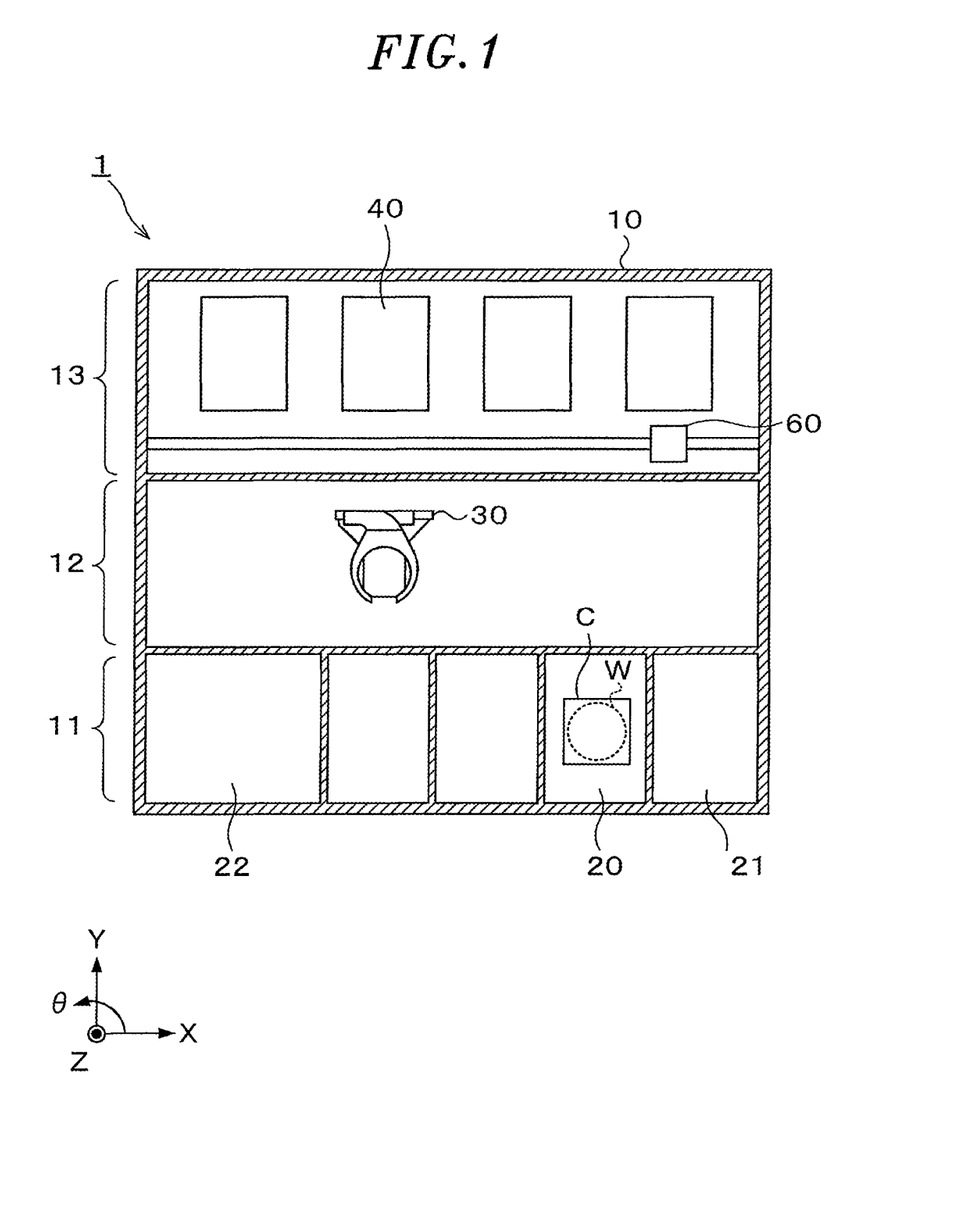
FIG. 1 is a horizontal cross-sectional view showing a schematic configuration of an inspection apparatus according to an embodiment.
Figure 2:
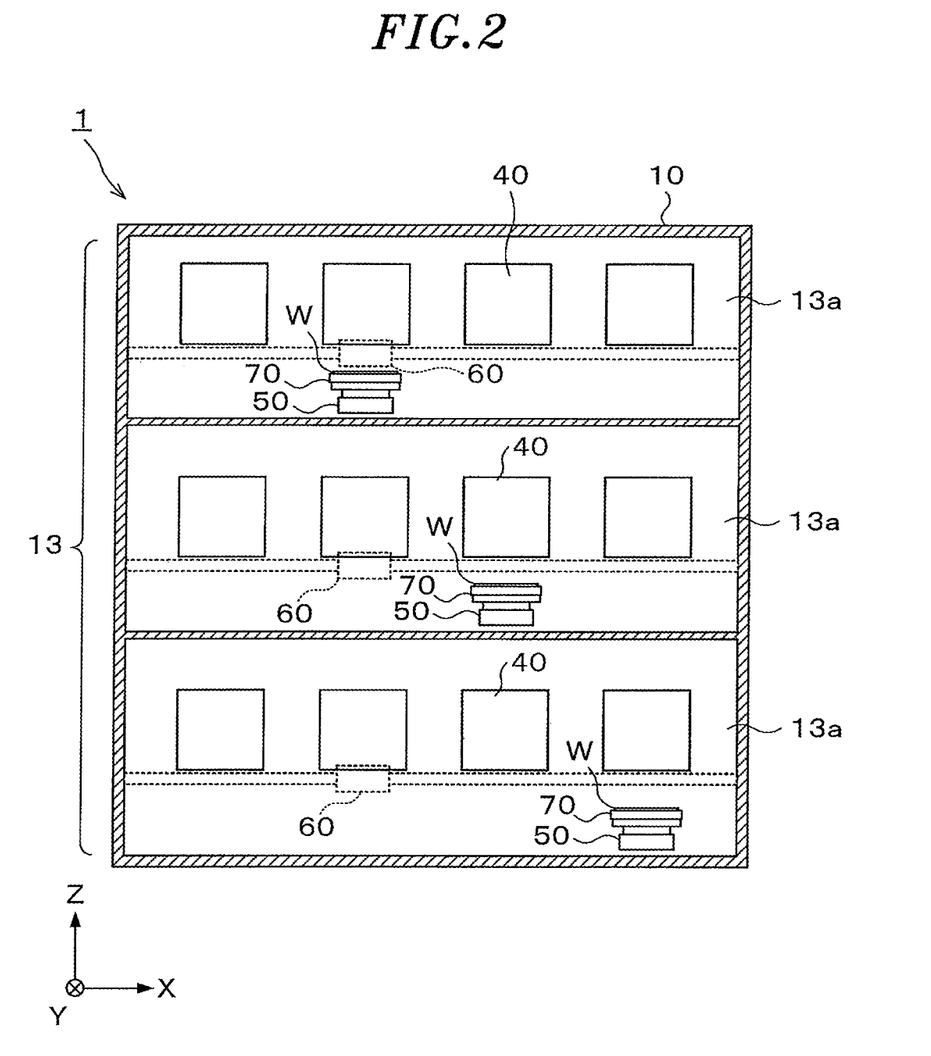
FIG. 2 is a vertical cross-sectional view showing a schematic configuration of the inspection apparatus according to the embodiment.

FIGS. 1 and 2 are a horizontal cross-sectional view and a vertical cross-sectional view, respectively, showing a schematic configuration of an inspection apparatus according to an embodiment of the present disclosure. FIG. 2 shows only a part of an aligner to be described later.

An inspection apparatus 1 shown in FIGS. 1 and 2 inspects a wafer W as a substrate. Specifically, the inspection apparatus 1 inspects the electrical characteristics of the semiconductor devices that are inspection target devices formed on the wafer W. The inspection apparatus 1 includes a housing 10 having a loading/unloading area 11, a transfer area 12, and an inspection area 13. In the loading/unloading area 11, the wafer W is loaded into and unloaded from the inspection apparatus 1. The transfer area 12 is formed to connect the loading/unloading area 11 and the inspection area 13. In the inspection area 13, the electrical characteristics of the semiconductor devices formed on the wafer W are inspected.

The loading/unloading area 11 has therein a port 20 for receiving a cassette C accommodating a plurality of wafers W, a loader 21 accommodating a probe card to be described later, and a controller 22 for controlling individual components of the inspection apparatus 1 are provided. The controller 22 is a computer having a CPU, a memory, or the like, and includes a storage device (not shown) that stores various information. The storage device stores programs for realizing an inspection process or the like, for example. The programs may be recorded in a computer-readable storage medium and installed in the controller 22 from the storage medium. The storage medium may be temporary or non-temporary. A part or all of the programs may be executed by a dedicated hardware (circuit board). The storage device is, e.g., a storage device such as a hard disk drive (HDD), a memory such as a random access memory (RAM) that temporarily stores required information related to the program calculation, or a combination thereof.

A transfer device 30 capable of moving while holding a wafer W or the like is disposed in the transfer area 12. The transfer device 30 transfers the wafer W between the cassette C in the port 20 of the loading/unloading area 11 and the inspection area 13. Further, the transfer device 30 transfers, among probe cards fixed to a pogo frame to be described later in the inspection area 13, a probe card requiring maintenance to the loader 21 in the loading/unloading area 11. In addition, the transfer device 30 transfers a new probe card or a probe card that has been subjected to the maintenance from the loader 21 into the inspection area 13.

A plurality of testers 40 are disposed in the inspection area 13. Specifically, as shown in FIG. 2, for example, the inspection area 13 is horizontally divided into three areas 13a and four testers 40 are horizontally (the X direction in the drawing) arranged in a tester row in each of the vertically divided areas 13a. One aligner 50 serving as a moving mechanism and one upper camera 60 are disposed in each of the vertically divided areas 13a. The number and arrangement of the testers 40, the aligners 50, and the upper cameras 60 may be arbitrarily selected.

Each of the testers 40 transmits and receives electric signals for electrical characteristic inspection to and from the wafer W. The aligner 50 is configured to hold and move a chuck top 70 to be described later in the horizontal direction (the X direction and the Y direction in the drawing, and the θ direction about the Z-axis in the drawing) and the vertical direction (the Z direction in the drawing). Further, the aligner 50 is used for aligning the position between the wafer W placed on the chuck top 70 and probes of a probe card to be described later.

The upper camera 60 is directed downward. In one embodiment, the upper camera 60 is configured to be horizontally movable. The upper camera 60 is disposed in an area in front of (negative side in the Y direction in the drawing) each tester 40 in the inspection area 13 where the upper camera 60 is disposed, which is an area that does not overlap a pogo frame to be described later in plan view, and images the wafer W placed on the chuck top 70 on the aligner 50. Further, the upper camera 60 is controlled by the controller 22. The imaging result of the upper camera 60 is outputted to the controller 22.

The chuck top 70 is an example of a placing member. The wafer W is placed on the chuck top 70. The chuck top 70 can hold the wafer W placed thereon by attraction or the like, for example.

In this inspection apparatus 1, while the transfer apparatus 30 is transferring one wafer W toward one tester 40, another tester 40 can inspect the electrical characteristics of the electronic devices formed on a different wafer W.

<Inspection Area>

Figure 3:
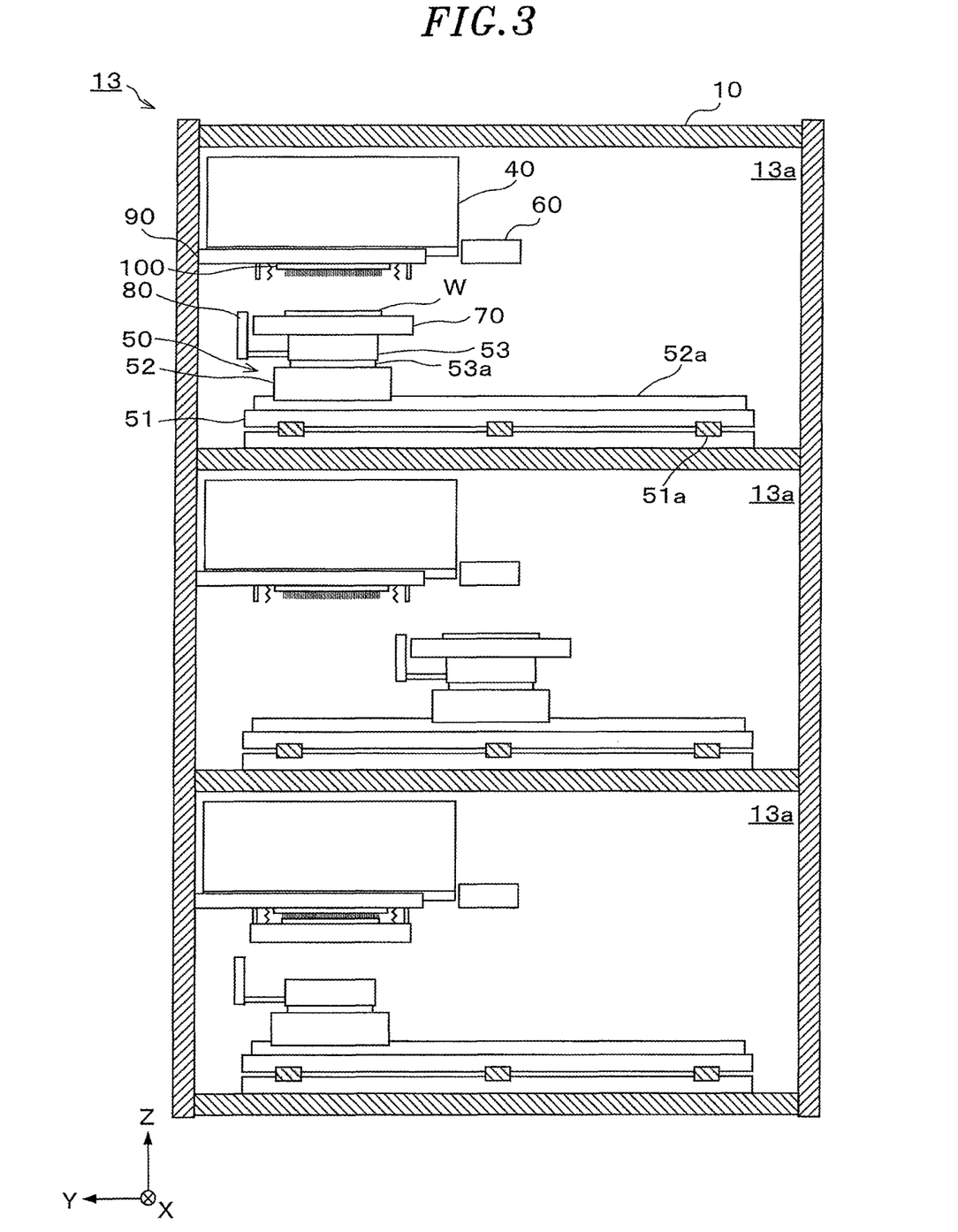
FIG. 3 is a side cross-sectional view of an inspection area.
Figure 4:
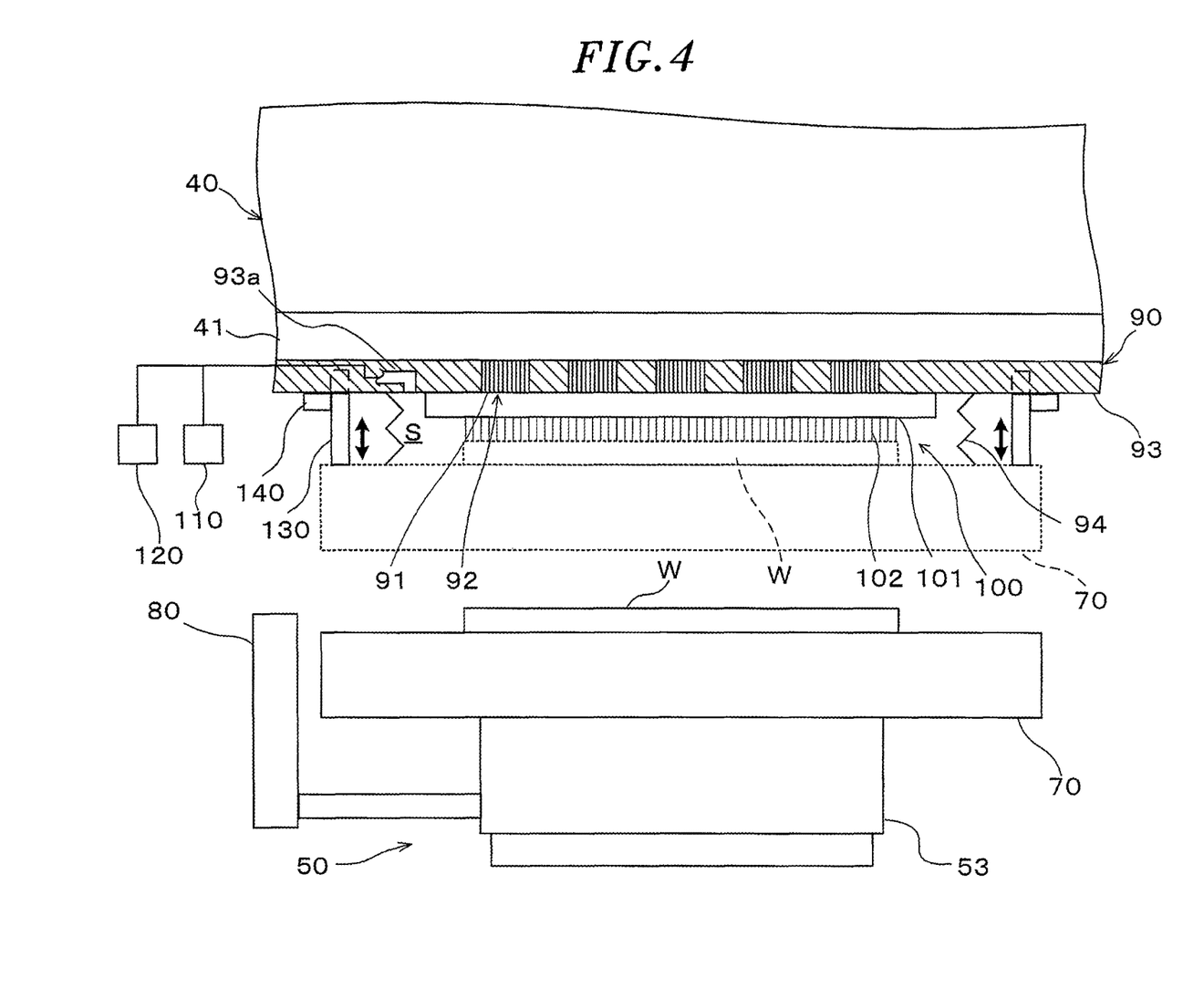
FIG. 4 is a cross-sectional view around a pogo frame.
Figure 5:
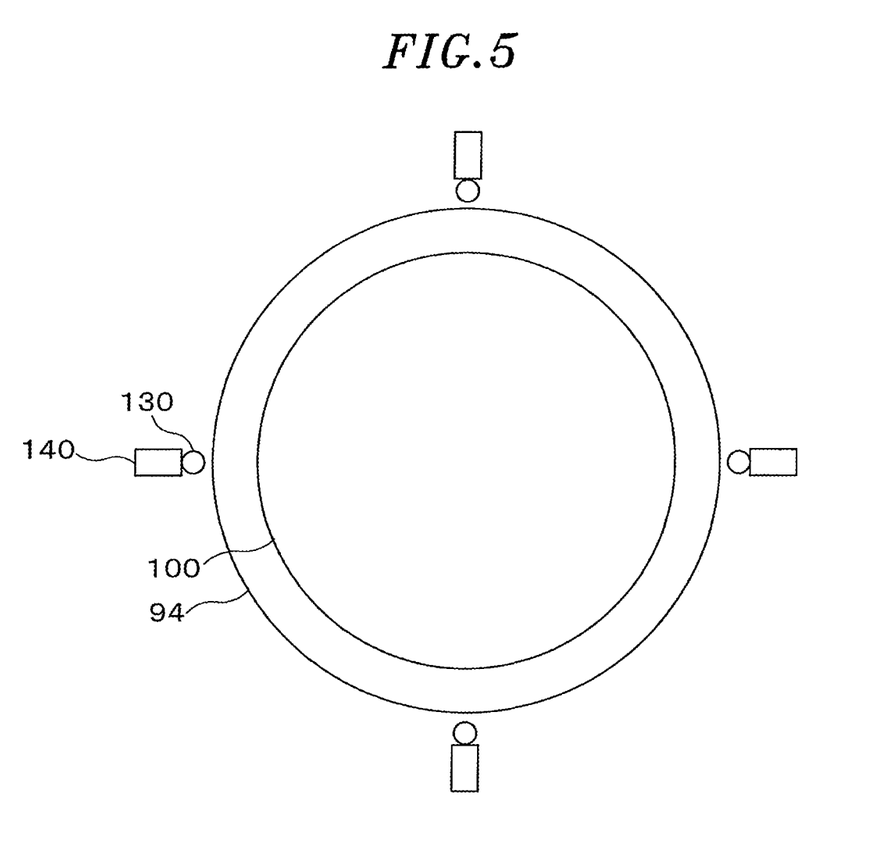
FIG. 5 is a schematic partially enlarged view of a bottom surface of the pogo frame.

Next, a specific configuration of the inspection area 13 will be described with reference to FIGS. 3 to 5. FIG. 3 is a side cross-sectional view of the inspection area 13. FIG. 4 is a cross-sectional view around a pogo frame to be described later. FIG. 5 is a schematic partially enlarged view of a bottom surface of the pogo frame to be described later. In FIG. 5, the illustration of probes to be described later is omitted.

In each divided area 13a of the inspection area 13, the aligner 50 and the upper camera 60 are disposed as described above. As shown in FIG. 3, a lower camera 80, a pogo frame 90, and a probe card 100, which will be described later, are disposed in each divided area 13a.

The aligner 50 has an X stage 51, a Y stage 52, and a Z stage 53, for example.

The X stage 51 moves along a guide rail 51a in the X-axis direction that constitutes the coordinate system of the movement plane (XY plane) of the aligner 50. The X stage 51 is provided with a position detection mechanism (not shown) for detecting the position of the X stage 51 in the X direction, i.e., the position of the chuck top 70 in the X-axis direction. The position detection mechanism is a linear encoder, for example.

The Y stage 52 moves on the X stage 51. Specifically, the Y stage 52 moves along a guide rail 52a in the Y-axis direction that constitutes the coordinate system of the movement plane (XY plane) of the aligner 50. The Y stage 52 is provided with a position detection mechanism (not shown) for detecting the position of the Y stage 52 in the Y-axis direction, i.e., the position of the chuck top 70 in the Y-axis direction. The position detection mechanism is a linear encoder, for example.

The Z stage 53 moves in a height direction (Z direction) perpendicular to the movement plane (XY plane) of the aligner 50 by an extensible/contractible shaft 53a capable of extending and contracting in the height direction (Z direction). The Z stage 53 is provided with a position detection mechanism (not shown) for detecting the position of the Z stage 53 in the Z direction, i.e., the position of the chuck top 70 in the Z direction. The position detection mechanism is a linear encoder, for example.

The chuck top 70 is detachably attracted and held on the Z stage 53. The chuck top 70 is attracted and held on the Z stage 53 by vacuum attraction of an attraction holding mechanism (not shown) or the like.

The lower camera 80 is an example of a detection device, and is used for detecting probes (to be described later) and positioning pins (to be described later) disposed at the probe card 100. The lower camera 80 is an example of an imaging device, and is directed upward.

The lower camera 80 is fixed to the aligner 50. Specifically, the lower camera 80 is fixed to the Z stage 53 of the aligner 50. Accordingly, the lower camera 80 can be moved together with the chuck top 70 by the aligner 50.

For example, the lower camera 80 is positioned below the probe card 100 fixed to the pogo frame 90 to image the probe card 100.

The aligner 50 and the lower camera 80 are controlled by the controller 22. The imaging result of the lower camera 80 and the position detection result of the position detection mechanisms disposed at the X stage 51, the Y stage 52, and the Z stage 53 are outputted to the controller 22.

As shown in FIG. 4, each tester 40 has a tester motherboard 41 disposed on a bottom surface thereof. A plurality of inspection circuit boards (not shown) are mounted upright on the tester motherboard 41. A plurality of electrodes (not shown) are disposed on the bottom surface of the tester motherboard 41.

The pogo frame 90 is disposed under the tester 40.

The pogo frame 90 is an example of a holder, and holds the probe card 100. The pogo frame 90 electrically connects the probe card 100 and the tester 40. The pogo frame 90 has pogo pins 91 for the above-described electrical connection. Specifically, the pogo frame 90 has pogo blocks 92 holding the pogo pins 91. The pogo frame 90 includes a frame body 93 to which the pogo blocks 92 are attached.

The probe card 100 is fixed to the bottom surface of the pogo frame 90 while being aligned to a predetermined position.

By using an exhaust mechanism (not shown), the tester motherboard 41 is vacuum-attracted to the pogo frame 90 and the probe card 100 is vacuum-attracted to the pogo frame 90. Due to the vacuum attraction force for performing vacuum attraction, the lower ends of the pogo pins 91 of the pogo frame 90 are brought into contact with the corresponding electrodes on the upper surface of a card body 101 (to be described later) of the probe card 100, and the upper ends of the pogo pins 91 are pressed against the corresponding electrodes on the bottom surface of the tester motherboard 41.

The probe card 100 includes the disc-shaped card body 101 having multiple electrodes on an upper surface of the card body 101. Multiple probes 102 that are needle-shaped contact terminals extending downward are disposed on the bottom surface of the card body 101.

The electrodes disposed on the upper surface of the card body 101 are electrically connected to the corresponding probes 102. At the time of inspection, the probes 102 are respectively brought into contact with the electrodes (not shown) of the semiconductor devices formed on the wafer W. Therefore, at the time of the electrical characteristic inspection, the electric signals for inspection are transmitted and received between the tester motherboard 41 and the semiconductor devices on the wafer W through the pogo pins 91, the electrodes on the upper surface of the card body 101, and the probes 102.

In the inspection apparatus 1, the plurality of probes 102 are disposed to cover substantially the entire bottom surface of the card body 101 in order to simultaneously inspect the electrical characteristics of the semiconductor devices formed on the wafer W.

A bellows 94 is attached to the bottom surface of the pogo frame 90. The bellows 94 is an extensible/contractible tubular member and forms a sealed space S between the chuck top 70 and the pogo frame 90. The bellows 94 is suspended from the pogo frame 90 and surrounds the probe card 100. The bellows 94 attracts and holds the chuck top 70 below the probe card 100 as indicated by a dotted line in FIG. 4.

The bellows 94 forms the sealed space S where the probe card 100 and the wafer W are disposed by attracting and holding the chuck top 70. The sealed space S is surrounded by the pogo frame 90, the bellows 94, and the chuck top 70, and communicates with one end of an exhaust passage 93a formed at the frame body 93 of the pogo frame 90. A decompressing mechanism 110 and an atmosphere opening mechanism 120 are connected to the other end of the exhaust passage 93a.

The decompressing mechanism 110 reduces a pressure in the sealed space S. Accordingly, the contact state between the wafer W and the probes 102 is maintained. The decompressing mechanism 110 includes a vacuum pump for evacuating the sealed space S, and a switching valve for switching the start and stop of the exhaust operation using the vacuum pump, and is controlled by the controller 22.

The atmosphere opening mechanism 120 for restoring a pressure in the sealed space S to an atmospheric pressure introduces the atmosphere into the sealed space S. The atmosphere opening mechanism 120 has a switching valve for switching the start and stop of the introduction of the atmosphere into the sealed space S, and is controlled by the controller 22.

In order to restore the pressure in the sealed space S to an atmospheric pressure, an inert gas or the like may be introduced instead of the atmosphere.

In the present embodiment, a plurality of positioning pins 130 are provided. The positioning pins 130 as positioning members protrude downward from the pogo frame 90 side and are brought into contact with the upper surface of the chuck top 70 to define the height of the chuck top 70 with respect to the probes 102. Specifically, the positioning pins 130 protrude downward from the bottom surface of the pogo frame 90 and have lower ends that are brought into contact with the upper surface of the chuck top 70 to define the height of the upper surface of the chuck top 70.

As shown in FIG. 5, for example, the positioning pins 130 are spaced apart from each other (specifically, at regular intervals) on the same circumference about the center of the probe card 100 along the outer periphery of the bellows 94 in the area outside the bellows 94. The positioning pins 130 have a cylindrical shape, for example.

The number of the positioning pins 130 is not limited to four in the example of FIG. 5, and may be five or more or may be three as long as it is possible to maintain the horizontal posture of the chuck top 70 whose height is defined by the corresponding positioning pins 130.

Further, in the present embodiment, an adjustment mechanism 140 for adjusting the height of each positioning pin 130 is provided for each positioning pin 130.

Specifically, the adjustment mechanism 140 adjusts the heights of the lower ends of the positioning pins 130. In other words, the adjustment mechanism 140 adjusts the downward projecting length (i.e., the projecting amount) of the positioning pins 130 from the bottom surface of the pogo frame 90.

The adjustment mechanism 140 has, for example, a driving device (not shown) for driving vertical movement of the positioning pins 130 to adjust the heights of the corresponding positioning pins 130. The driving device has, for example, a motor (not shown) as a driving device for generating a driving force for the vertical movement of the positioning pins 130. The driving device also has an encoder (not shown) connected to the motor. The encoder outputs the number of pulses corresponding to the movement amount of the positioning pins 130 by the motor to the controller 22. The controller 22 can acquire the heights of the corresponding positioning pins 130 based on the output from the encoder.

The driving device of the adjustment mechanism 140 includes a torque detection device as a detection device for detecting a load of the corresponding driving device. The torque detection device detects, e.g., the torque of the motor of the driving device and outputs the detection result to the controller 22. The controller 22 can detect the contact between the corresponding positioning pins 130 and the chuck top 70 based on the output from the torque detection device.

<Inspection Process Using the Inspection Apparatus 1>

Next, an inspection process using the inspection apparatus 1 will be described with reference to FIGS. 6 to 12.

(S1: Loading)

First, the wafer W that is an inspection target is loaded into a desired divided area 13*a*.

Specifically, the controller 22 controls the transfer device 30 or the like to transfer the wafer W from the cassette C in the port 20 of the loading/unloading area 11 into an intermediate divided area 13*a* and place the wafer W on the chuck top 70 attracted and held by the aligner 50.

(S2: Acquisition of the Horizontal Positions and Heights of the Probes)

Figure 6:
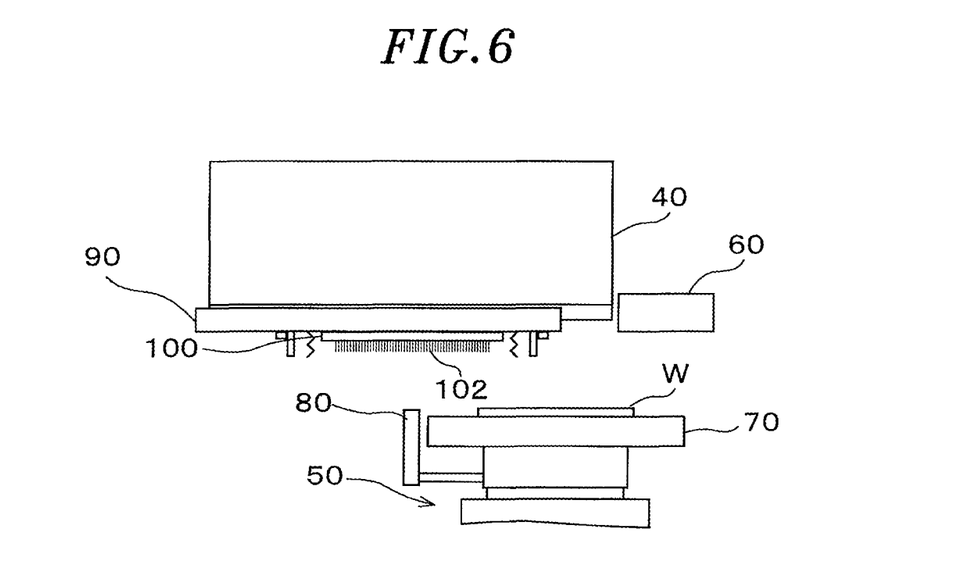
FIGS. 6 to 12 explain an inspection process using the inspection apparatus according to the embodiment.

Next, the controller 22 acquires the positions of the probes 102 in the horizontal direction (hereinafter, referred to as "horizontal positions") based on the detection result of the probes 102 using the lower camera 80. Specifically, as shown in FIG. 6, the chuck top 70 is moved by the aligner 50 such that the lower camera 80 is positioned under the probe card 100 under the control of the controller 22. Then, the controller 22 acquires the horizontal positions and heights of the probes 102 are acquired by the controller 22 based on the imaging result of the lower camera 80 and the detection result of the position detection mechanism of the aligner 50.

The horizontal positions and heights of the probes 102 are, e.g., the horizontal positions and heights related to the centers of gravity of the lower ends of the probes 102 positioned at predetermined multiple locations among the probes 102 disposed at the probe card 100.

(S3: Acquisition of the Heights of the Positioning Pins)

Figure 7:
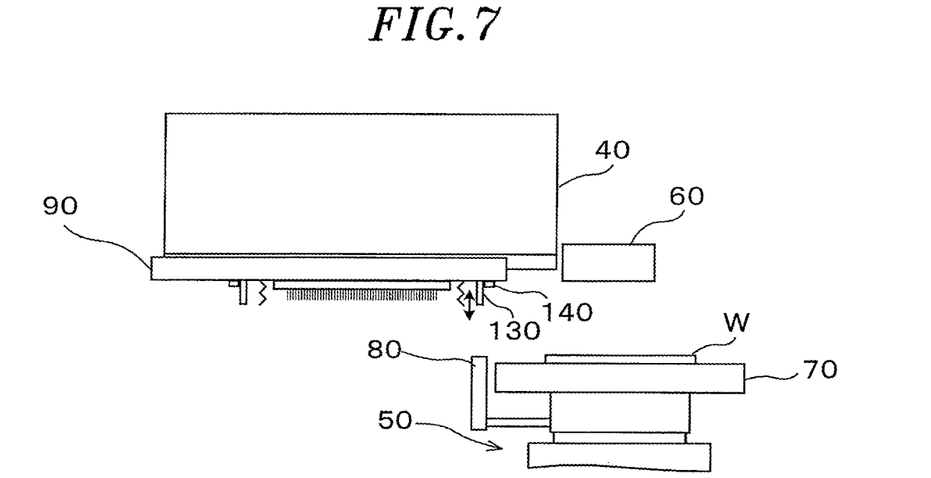

Next, the controller 22 acquires the heights of the positioning pins 130 using the lower camera 80. Specifically, as shown in FIG. 7, the chuck top 70 is moved by the aligner 50 such that the lower camera 80 is positioned under the positioning pins 130 under the control of the controller 22. Then, the controller 22 acquires the heights of the positioning pins 130 based on the imaging result of the lower camera 80 and the detection result of the position detection mechanism of the aligner 50. Specifically, the heights of the positioning pins 130 are the heights of the lower ends of the positioning pins 130.

In one embodiment, the heights of the respective positioning pins 130 are acquired.

(S4: Acquisition of the Horizontal Position and Height of the Wafer)

Figure 8:
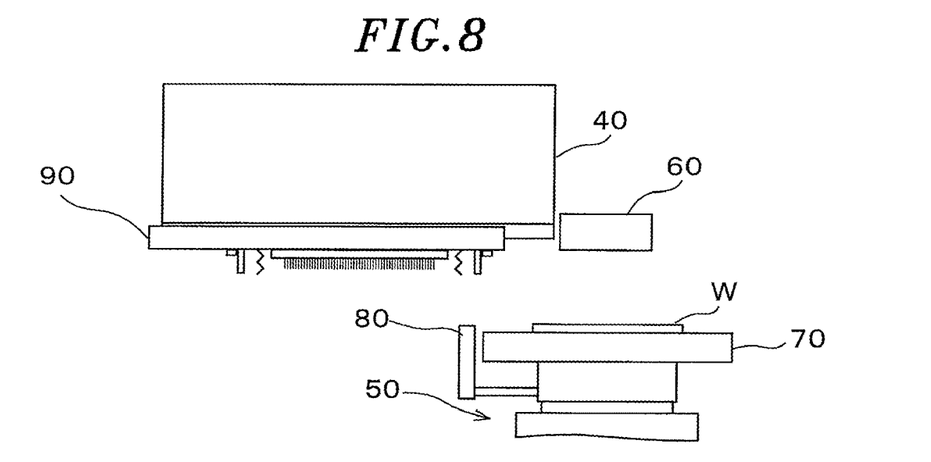

Next, the controller 22 uses the upper camera 60 to acquire the horizontal position and height of the wafer W on the chuck top 70 held by the aligner 50. Specifically, as shown in FIG. 8, the chuck top 70 is moved by the aligner 50 to a position under the upper camera 60 under the control of the controller 22. Then, the controller 22 acquires the horizontal position and height of the wafer W on the chuck top 70 based on the imaging result of the upper camera 60 and the detection result of the position detection mechanism of the aligner 50.

The horizontal position of the wafer W is, e.g., the horizontal position related to the centers of gravity of the electrodes located at predetermined multiple positions among the electrodes formed on the wafer W.

(S5: Acquisition of the Height of the Chuck Top)

Figure 9:
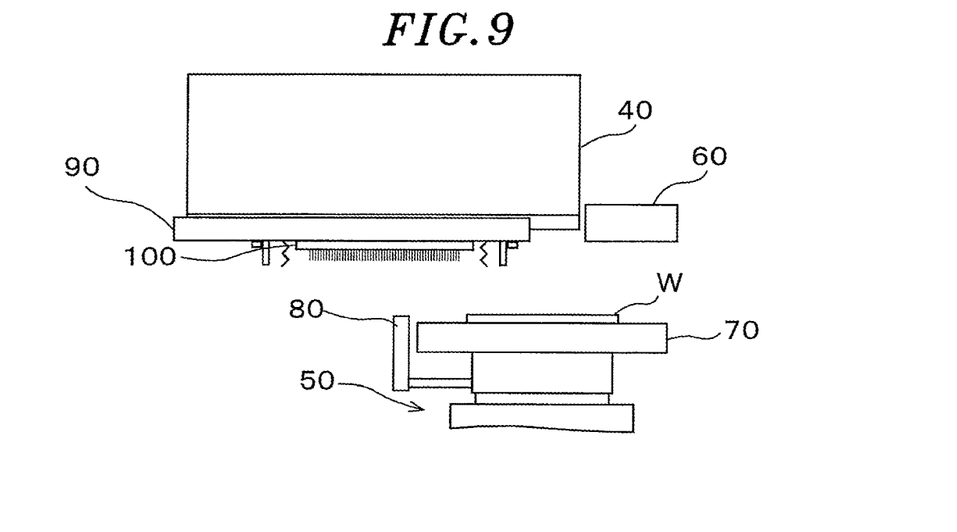

The controller 22 acquires the height of the chuck top 70 held by the aligner 50 using the upper camera 60. Specifically, as shown in FIG. 9, the chuck top 70 is moved by the aligner 50 to a position under the upper camera 60 under the control of the controller 22. Then, the controller 22 acquires the height of the chuck top 70 to be in contact with the positioning pins 130 based on the imaging result of the upper camera 60 and the detection result of the position detection mechanism of the aligner 50. Specifically, the height of the chuck top 70 is the height of the upper surface of the outer peripheral portion of the chuck top 70.

(S6: Adjustment of the Positioning Pins to the Reference Height)

Then, based on the heights of the probes 102, the heights of the positioning pins 130, the height of the wafer W, and the height of the chuck top 70 acquired by the controller 22, the heights of the positioning pins 130, i.e., the downward projecting lengths of the positioning pins 130, are set such that the overdrive amount OD becomes zero. In other words, the positioning pin 130 is positioned at the reference height at which the overdrive amount OD becomes zero by the adjustment mechanism 140. This reference height is set such that the timing at which the probes 102 are brought into contact with the wafer W and the timing at which the positioning pins 130 are brought into contact with the chuck top 70 are substantially the same.

In the case of setting of the height of the wafer W, the height of the wafer W acquired by the controller 22 may not be used. Instead, pre-stored information on the thickness of the wafer W may be used.

(S7: Movement of the Wafer W to a Position Under the Probe Card)

Figure 10:
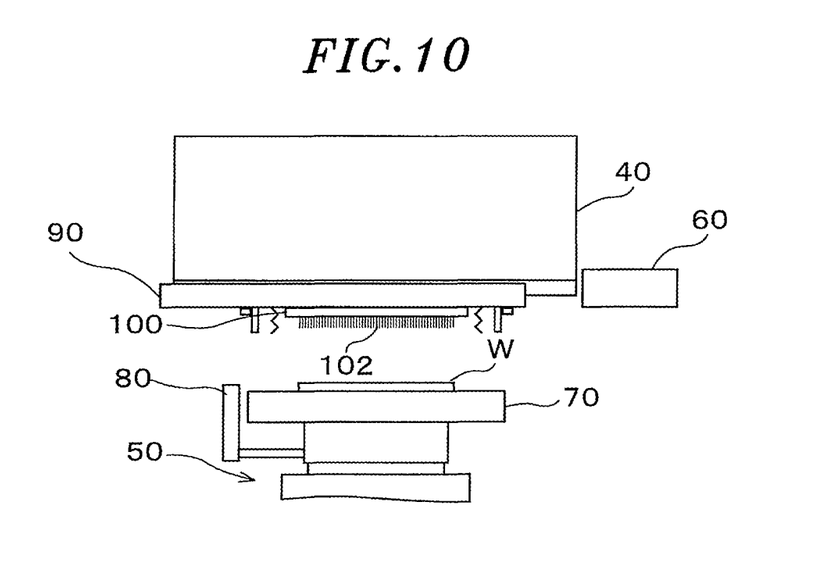

After the steps S2 to S6, as shown in FIG. 10, the chuck top 70 is moved to a position under the probe card 100 by the aligner 50 under the control of the controller 22. At this time, the wafer W and the probes 102 of the probe card 100 are aligned based on the results obtained in the steps S2 and S4.

(S8: Formation of the Sealed Space)

Figure 11:
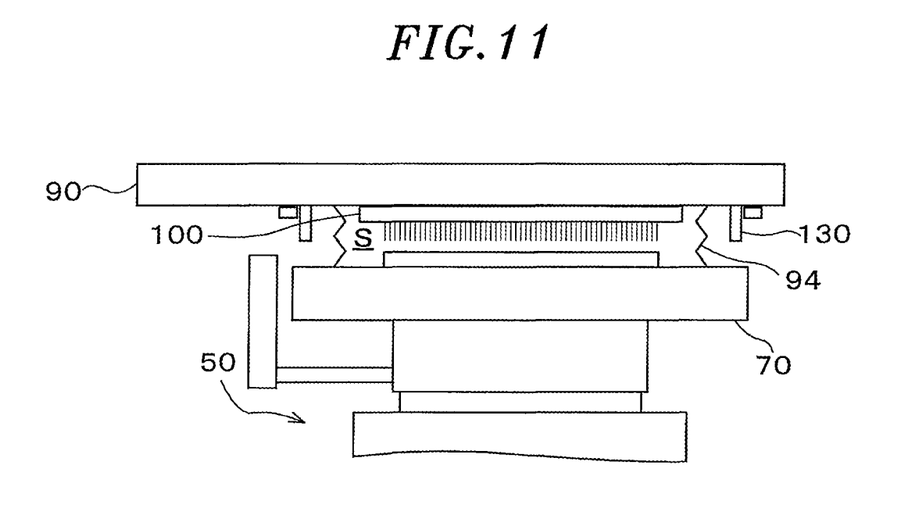

Then, as shown in FIG. 11, the chuck top 70 is raised by the aligner 50 to form the sealed space S under the control of the controller 22. Specifically, for example, under the control of the controller 22, the chuck top 70 is raised by the aligner 50 until the chuck top 70 is in contact with the lower end of the bellows 94, and then attracted and held by the bellows 94. Accordingly, the sealed space S where the probe card 100 and the wafer W are disposed, which is surrounded by the pogo frame 90, the bellows 94, and the chuck top 70, is formed.

(S9: Depressurization of the Sealed Space and Contact Between the Positioning Pins and the Chuck Top)

Next, under the control of the controller 22, a pressure in the sealed space S is reduced, and the positioning pins 130 whose heights are adjusted to the reference height are brought into contact with the upper surface of the chuck top 70. Due to this contact, the wafer W on the chuck top 70 is maintained to be in parallel with the probes 102.

Figure 12:
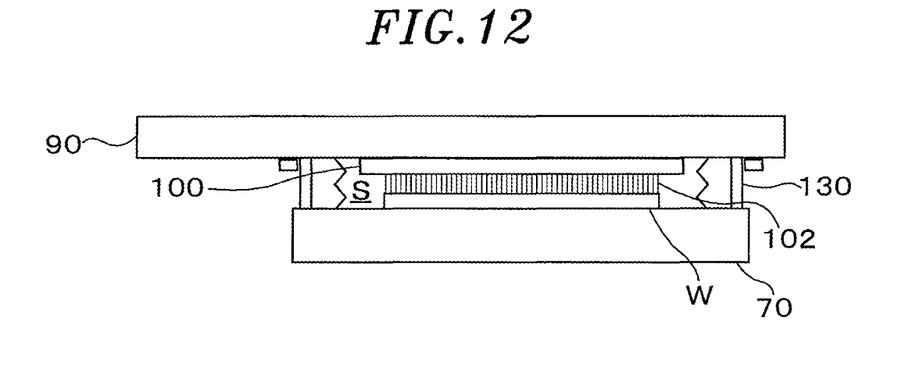

Specifically, for example, under the control of the controller 22, the chuck top 70 is separated from the aligner 50, and a pressure in the sealed space S is reduced by the decompressing mechanism 110. Accordingly, the chuck top 70 is raised, so that the wafer W on the chuck top 70 is brought into contact with the probes 102 and the lower ends of the positioning pins 130 are brought into contact with the upper surface of the chuck top 70 as shown in FIG. 12.

(S10: Raising of the Chuck Top and the Height Adjustment of the Positioning Pins 130)

Then, the controller 22 acquires the heights of the positioning pins 130 at which a desired overdrive amount OD is obtained, i.e., target heights of the positioning pins 130, and the chuck top 70 is raised by adjusting the raising amounts of the positioning pins 130 using the adjustment mechanism 140. Specifically, the controller 22 acquires the target heights of all the positioning pins 130 from the storage device (not shown), monitors the driving amounts of the positioning pins 130 by the adjustment mechanism 140, which are related to the heights of the positioning pins 130, and moves the positioning pins 130 to the target heights. At this time, the reduction of the pressure in the sealed space S is continued, so that the chuck top 70 is raised by the raising of the positioning pins 130. Accordingly, the probes 102 can be brought into uniform contact with the wafer W at a desired contact pressure.

When the chuck top 70 is raised, the driving amounts of the positioning pins 130 are adjusted by the adjustment mechanism 140 such that the contact between all the positioning pins 130 and the chuck top 70 is maintained. Accordingly, the horizontality of the chuck top 70 can be maintained.

(S11: Inspection)

Then, the electrical characteristics of the electronic devices formed on the wafer W are inspected under the control of the controller 22.

The electric signals for inspecting electrical characteristics are inputted from the tester 40 to the electronic devices through the pogo pins 91, the probes 102, and the like.

(S12: Unloading)

Thereafter, the inspected wafer W is unloaded.

Specifically, under the control of the controller 22, the chuck top 7 that has been attracted to the bellows 94A is transferred to and held by the aligner 50. The transfer device 30 transfers the inspected wafer W on the chuck top 70 held by the aligner 50 from the inspection area 13 to the cassette C in the port 20 of the loading/unloading area 11.

The steps S1 to S12 are executed for each wafer W. During the inspection in one tester 40, the transfer device 30 transfers a wafer W that is another inspection target to a different tester 40 and collects another inspected wafer W from a different tester 40.

Main Effects of the Present Embodiment

In the present embodiment, in the case of performing inspection, the chuck top 70 is raised by raising the positioning pins 130 with respect to the reference height of the positioning pins 130 calculated from the result of the camera, i.e., the contact height at which the probes 102 are in contact with the wafer W (the position at which the overdrive amount OD is zero). Therefore, the probes 102 and the wafer W can be brought into proper contact with each other. Since horizontality of the chuck top 70 is maintained by the positioning pins 130, it is possible to achieve uniform in-plane contact with a desired overdrive amount.

Further, in the present embodiment, the lower camera 80 is used for actual detection of (the lower ends of) the positioning pins 130. Then, the reference heights of the positioning pins 130 are set based on the detection result. Therefore, the heights of (the lower ends of) the positioning pins 130 can be set to the target heights regardless of the state of the positioning pins 130 (e.g., a degree of thermal expansion of the positioning pins 130 or the inclination of the positioning pins 130). Accordingly, the probes 102 and the wafer W can be brought into proper contact with each other regardless of the state of the positioning pins 130.

It should be noted that the embodiments of the present disclosure are illustrative in all respects and are not restrictive. The above-described embodiments may be omitted, replaced, or changed in various forms without departing from the scope of the appended claims and the gist thereof.

For example, the positioning pin 130 may be disposed on the chuck top 70 side and may be in contact with the bottom surface of the pogo frame 90.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. An inspection apparatus for inspecting a substrate, comprising:
 a placing member on which a substrate is placed;
 a holder configured to hold a probe card having probes to be in contact with the substrate;
 a plurality of positioning members to be in contact with an upper surface of the placing member or a bottom surface of the holder to define a height of the placing member with respect to the probes;
 an adjustment mechanism configured to adjust heights of the positioning members;
 a detection device configured to detect the probes, the placing member and the positioning members; and
 a controller, wherein the controller is configured to execute:

acquiring heights of the probes based on a detection result of the probes using the detection device;

acquiring a height of the placing member based on a detection result of the placing member using the detection device;

acquiring a height of the positioning member based on a detection result of the positioning member using the detection device;

positioning the positioning member, using the adjustment mechanism, to a reference height at which an overdrive amount becomes zero, based on the detection results of the probes, the placing member, and the positioning member using the detection device; and acquiring a height of the positioning member at which a desired overdrive amount is obtained, and raising the placing member while adjusting a driving amount of the adjustment mechanism until the placing member reaches the height of the positioning member at which the desired overdrive amount is obtained.

2. The inspection apparatus of claim 1, wherein the reference height at which the overdrive amount becomes zero is a height at which the substrate on the placing member is in contact with the probes.

3. The inspection apparatus of claim 1, further comprising:

an extensible/contractible cylindrical member forming a sealed space between the placing member and the holder; and an exhaust path through which a pressure in the sealed space is reduced, wherein the controller is configured to reduce the pressure in the sealed space where the substrate and the probe card are disposed.

4. The inspection apparatus of claim 1, wherein the reference height is set for each of the positioning members.

5. An inspection method for inspecting a substrate by an inspection apparatus, wherein the inspection apparatus includes:

a placing member on which a substrate is placed;

a holder configured to hold a probe card having probes to be in contact with the substrate;

a plurality of positioning members to be in contact with an upper surface of the placing member or a bottom surface of the holder to define a height of the placing member with respect to the probes;

an adjustment mechanism configured to adjust heights of the positioning members; and a detection device configured to detect the probes, the placing member and the positioning members, the method comprising:

acquiring heights of the probes based on a detection result of the probes using the detection device;

acquiring a height of the placing member based on a detection result of the placing member using the detection device;

acquiring a height of the positioning member based on a detection result of the positioning member using the detection device;

positioning the positioning member, using the adjustment mechanism, to a reference height at which an overdrive amount becomes zero, based on the detection results of the probes, the placing member, and the positioning member using the detection device; and acquiring a height of the positioning member at which a desired overdrive amount is obtained, and raising the placing member while adjusting a driving amount of the adjustment mechanism until the placing member reaches the height of the positioning member at which the desired overdrive amount is obtained.

* * * * *